US009724592B2

(12) United States Patent
Hart et al.

(10) Patent No.: US 9,724,592 B2
(45) Date of Patent: Aug. 8, 2017

(54) SNOW SPORT EQUIPMENT WAXING DEVICE AND METHOD

(71) Applicant: SKIQUIKY LLC, Blackfoot, ID (US)

(72) Inventors: Jonathan Hart, Salt Lake City, UT (US); Naeem Rahim, Pocatello, ID (US); Devin Owen Howells, Salt Lake City, ID (US); Chris Witham, Midvale, UT (US); Fahim Rahim, Pocatello, ID (US)

(73) Assignee: SKIQUICKY, INC., Blackfoot, ID (US)

( * ) Notice: Subject to any disclaimer, the term of this patent is extended or adjusted under 35 U.S.C. 154(b) by 0 days.

(21) Appl. No.: 14/545,164

(22) Filed: Apr. 1, 2015

(65) Prior Publication Data

US 2016/0287972 A1 Oct. 6, 2016

(51) Int. Cl.

| | |
|---|---|
| ***B05C 1/00*** | (2006.01) |
| ***B05B 7/16*** | (2006.01) |
| ***B05C 11/00*** | (2006.01) |
| ***C23C 16/52*** | (2006.01) |
| ***C23C 28/00*** | (2006.01) |
| ***A63C 11/08*** | (2006.01) |
| ***B05B 15/00*** | (2006.01) |
| ***B05D 1/02*** | (2006.01) |
| ***B05D 3/00*** | (2006.01) |
| ***A63C 11/04*** | (2006.01) |
| ***A63C 11/06*** | (2006.01) |

(Continued)

(52) U.S. Cl.

CPC .............. *A63C 11/08* (2013.01); *A63C 11/04* (2013.01); *A63C 11/06* (2013.01); *A63C 11/14* (2013.01); *B05B 15/00* (2013.01); *B05D 1/02* (2013.01); *B05D 3/002* (2013.01); *B24B 3/006* (2013.01)

(58) Field of Classification Search

USPC ......... 118/202, 242, 59, 103, 109, 697, 698, 118/302, 323; 206/315.1; 427/8, 427.2, 427/427.3, 314

See application file for complete search history.

(56) References Cited

U.S. PATENT DOCUMENTS 2,234,487 A * 3/1941 Davis .................... A63C 11/02 206/315.1
4,577,586 A 3/1986 Morris et al.

(Continued)

FOREIGN PATENT DOCUMENTS

CH 175057 A 2/1935
CH 687175 A5 10/1996

(Continued)

OTHER PUBLICATIONS

Patent Cooperation Treaty, Invitation to Pay Additional Fees and Where Applicable, Protest Fee, Jun. 14, 2016, see document for other details.

(Continued)

*Primary Examiner* — Yewebdar Tadesse

(74) *Attorney, Agent, or Firm* — Flaig Law Office, PLLC; Jason E. Flaig

(57) ABSTRACT

The invention includes an automated device and method for applying wax to snow sporting equipment. This includes skis and snowboards and provides kiosks where skiers and boarders can deposit their equipment in a track and have appropriate wax for current snow conditions applied to the equipment.

24 Claims, 6 Drawing Sheets

(51) Int. Cl.
*A63C 11/14* (2006.01)
*B24B 3/00* (2006.01)

(56) References Cited

U.S. PATENT DOCUMENTS

| | | | | |
|---|---|---|---|---|
| 4,717,601 | A * | 1/1988 | Bocquet | A63C 11/08 118/302 |
| 4,899,692 | A | 2/1990 | Suzuki | |
| 4,905,625 | A * | 3/1990 | Funke | A63C 11/08 118/200 |
| 5,209,780 | A * | 5/1993 | Partel | A63C 11/08 118/202 |
| 5,597,344 | A * | 1/1997 | Bocquet | A63C 11/04 156/468 |
| 5,620,519 | A * | 4/1997 | Affeldt | A23P 20/15 118/669 |
| 6,162,115 | A * | 12/2000 | Schudrich | A63C 11/04 451/57 |
| 6,659,494 | B1 | 12/2003 | Martin | |
| 7,887,084 | B2 | 2/2011 | Howell | |
| 8,827,302 | B2 | 9/2014 | Fritschi et al. | |

FOREIGN PATENT DOCUMENTS

| | | | |
|---|---|---|---|
| DE | 2164596 | A1 | 6/1973 |
| DE | 3833103 | A1 | 4/1990 |
| DE | 29705702 | U1 | 5/1997 |
| EP | 0671189 | A1 | 9/1995 |
| EP | 1685880 | A1 | 8/2006 |
| EP | 1847305 | A1 | 10/2007 |
| EP | 2614864 | A1 | 7/2013 |
| JP | H0213484 | A | 1/1990 |
| JP | 2011050722 | A | 3/2011 |
| WO | WO 2016161365 | A1 | 10/2016 |

OTHER PUBLICATIONS

Patent Cooperation Treaty, Notification of Transmittal of the International Search Report and the Written Opinion of the . . . see document for other details.

Patent Cooperation Treaty, Notification of Transmittal of the International Preliminary Report on Patentability, May 2, 2017, EPO, see document for other details.

* cited by examiner

SNOW SPORT EQUIPMENT WAXING DEVICE AND METHOD

BACKGROUND AND SUMMARY

Waxing is a surface treatment used on winter sports equipment such as skis or snowboards. It consists of applying a layer of ski wax on the surfaces that come into contact with the snow (e.g., soles or sliding surfaces). Ski wax improves the smoothness of the treated surface and maximizes performance of the treated equipment. Various waxes can be applied for top performance in various snow conditions, such as icy or loose powder.

Wax can be manually applied cold on the sole of sporting equipment by spraying liquid ski wax or rubbing solid wax along the surface of the sole. The wax adheres to the surface of the sole. Subsequent scraping may be used to remove excess ski wax and level the layer of wax along the sole. Alternatively, hot wax may be manually applied to the sole when wax is heated past its melting point and is then deposited on the sole by, e.g., rollers or is dripped on the sole and smoothed by a heated plate.

Waxing of winter sporting equipment is usually performed manually by applying the wax on the sole to be treated and removing excess wax, particularly from edges of the equipment. This may be done using an iron to spread melted wax on the sole and a spatula to remove excess, or by heating the equipment itself and applying solid wax which then locally melts upon contacting the heated equipment. This can require substantial time investment for proper wax application, scraping off excess, and brushing to smooth the wax surface to prepare equipment for optimal performance.

Semi-automated waxing devices apply wax by passing skis or snowboards over a stationary roller which dips into a reservoir of melted wax. Equipment can be heated in advance of wax being deposited on them to allow for better wax absorption on porous equipment soles. These waxing devices then can scrape off excess wax with brushes and/or scraping mechanisms. These waxing devices require a great deal of space for operation since skis are passed over the roller so twice the lateral length of skis are required for operation. They are generally intended for use in professional equipment technician shops and ill-suited for public use. This requires foresight for those participating in winter sports to plan ahead on tuning up their equipment and trying to select wax products for snow conditions in the future. State of the art waxing devices are also unfit for use in outdoor environments and require professional oversight and training for use.

In either manual or semi-automated waxing it is beneficial to select appropriate wax products to match snow conditions for optimal performance and desired results. However, when waxing equipment in advance one has to effectively make a best guess as to snow conditions in the future when participation in skiing or snowboarding will occur. This can lead to selection of improper wax with inaccurate characteristics for conditions the day of use. Also, either manual waxing or waxing performed by a technician requires substantial time investment by equipment owners which can be cumbersome.

A substantial unmet need in the art is for an automated device for applying wax to winter sport equipment that can be used publically, requires a limited amount of space for operation, and assists in proper selection of wax for snow conditions.

The disclosure overcomes the problems of the prior art by providing an automated device which cleans winter sporting equipment, applies wax, and scrapes off excess wax while contained in a housing that requires limited space and assists in selection of wax based on most current snow conditions. The disclosure also provides for a public kiosk where skiers and snowboarders can insert their equipment and have it waxed on-site. This does not require either a significant time investment in manual waxing or cumbersome acts of bringing equipment to a technician ahead of time.

Other aspects and advantages of embodiments of the present disclosure will become apparent from the following detailed description, taken in conjunction with the accompanying drawings, illustrated by way of example of the principles of the disclosure.

FIGURES

DETAILED DESCRIPTION

Figure 1:
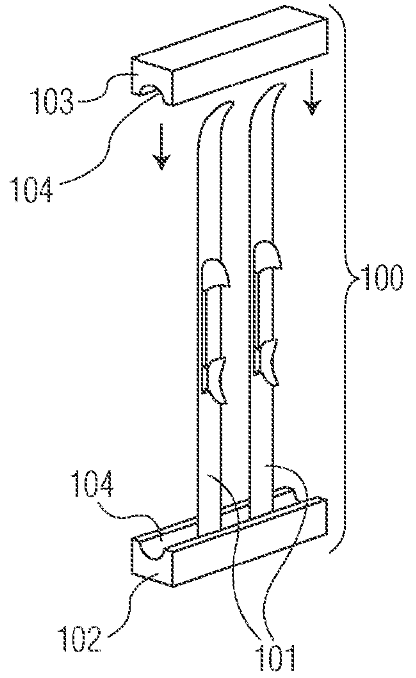
FIG. 1 depicts a rack for securing a pair of skis or a snowboard.

FIG. 1 depicts a mounting mechanism 100 for securing at least one pair of skis 101 or one or more snowboards (not shown) according to one embodiment of the disclosure. Mounting mechanism 100 could be, for example, a track, a clamp, a flat surface, a strap, an elastic cord, or any other known mechanism for securing elongated curved surfaces such as skis 101. A user of an automated waxing device may open a housing or kiosk to access mounting mechanism 100 or mounting mechanism 100 may be free standing. In the example of FIG. 1, a user can insert a bottom end of skis 101 in lower track portion 102 of mounting mechanism 100. This lower track portion 102 can be fixed or have some mobility to provide appropriate resistance to support at least one pair of skis 101 or one or more snowboards (not shown). Upper track portion 103 of mounting mechanism 100 can be manually lowered to secure skis 101 or can be automatically lowered by a motor until skis 101 are secured and then temporarily fixed in place. This allows a variety of ski and snowboard heights and widths to be accommodated by an automated waxing device during cleaning, waxing, and scraping. Lower track portion 102 and upper track portion 103 may also have various indentations 104 to aid in securing at least one pair of skis 101 or one or more snowboards (not shown). The indentations in lower track portion 102 and upper track portion 103 expose at least a significant portion of the sole of skis 101 for cleaning, application of wax, and scraping. Mounting mechanism 100 may also include a locking mechanism for locking skis 101 in place during operation of the automatic waxing device. The locking mechanism may secure the at least one pair of skis or at least one snowboard and provide adequate exposure and resistive force to allow the cleaning device, the waxing mechanism, and the scraping mechanism to effectively clean, wax, and scrape the at least one pair of skis or at least one snowboard. The locking mechanism will release when skis 101 are dry and ready for removal by a user. Upper track portion 103 and lower track portion 102 may also include materials along their inner surface which provide some elasticity to assist in holding skis 101 in place without damaging them, for example, rubber, polystyrene, or foam rubber.

Figure 2:
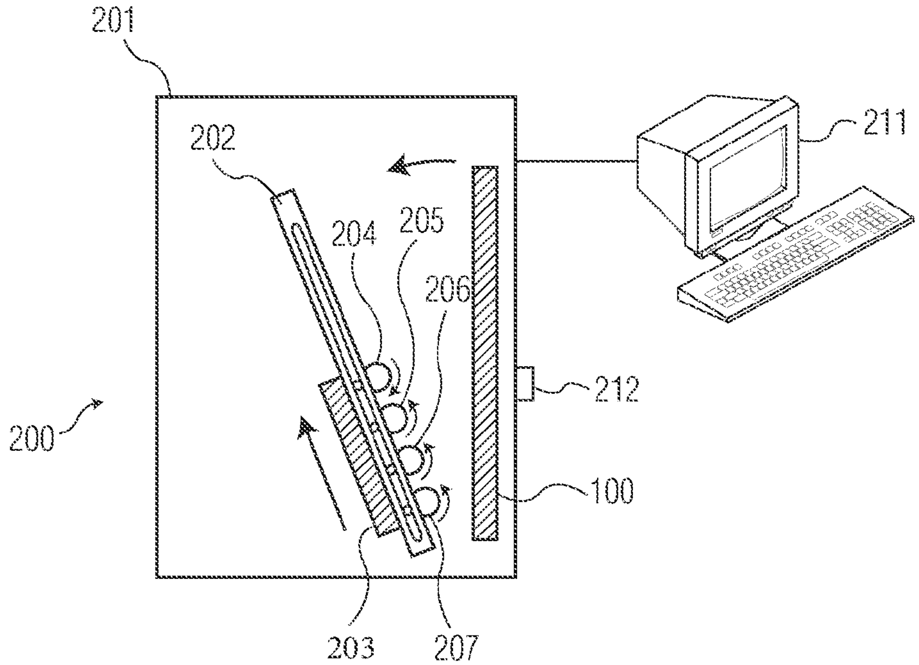
FIG. 2 depicts a cross section of an automated waxing device according to one embodiment of the disclosure.

FIG. 2 depicts a cross section of an automated waxing device 200. A user may input information such as snow conditions, type of skier/rider, make and model of skis/snowboard, desired type of wax, etc. into user interface 211. Further, user interface may also allow a user to perform payment for use of automated waxing device 200. User interface 211 may be a computer which can obtain snow conditions automatically and can automatically aide in the selection of, for example type of wax and steps for applying such wax. User interface 211 may allow a user to open housing 201 to insert their winter sporting equipment for automatic waxing upon, for example, receiving authorization of payment and instructing a locking mechanism 212 to unlock a door. Mounting mechanism 100 is initially aligned substantially vertically for a user to manually or automatically secure at least one pair of skis or at least one snowboard as described in reference to FIG. 1. Once skis 101 are secured, a housing 201 around waxing device 200 may be closed to keep cleaning or wax detritus from splattering beyond the housing. Automated waxing device includes a track 202 which can be fixed. Carriage 203 moves along track 202 displacing at least one of a cleaning portion 204 (also referred to herein as cleaning device 204 and cleaning mechanism 204), a waxing portion 205 (also referred to herein as waxing device 205 and waxing mechanism 205), a brushing portion 206 (also referred to herein as brushing device 206 and brushing mechanism 206), and a scraping portion 207 (also referred to herein as scraping device 207 and scraping mechanism 207).

Mounting mechanism 100 can be lowered to meet track 202 and align skis 101 such that cleaning portion 204, waxing portion 205, brushing portion 206, and scraping portion 207 will contact a sole of skis 101 and perform the desired cleaning, waxing, brushing, and scraping.

Alternatively mounting mechanism 100 can be fixed and track 202 can be raised to meet mounting mechanism 100. The substantially vertical alignment of automated waxing device 200 is particularly advantageous as compared to any prior art device at least because it requires the least horizontal footprint for performing cleaning, waxing, scraping, and brushing. In the configuration depicted in FIG. 2, cleaning portion 204, waxing portion 205, brushing portion 206, and scraping portion 207 are substantially cylindrical shaped and can be rotated by one or more motors 208. These one or more motors 208 can also move carriage 203 along track 202 to perform the automated cleaning, waxing, brushing, and scraping.

Figure 3:
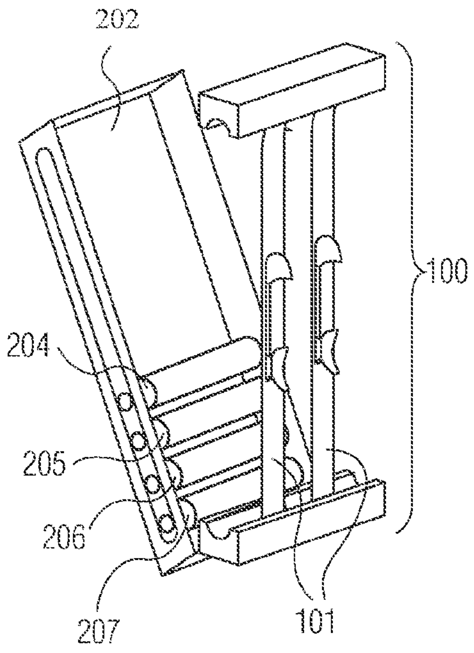
FIG. 3 depicts a rotated view of the automated waxing device of FIG. 2.

FIG. 3 depicts a rotated view of the automated waxing device of FIG. 2.

In this configuration, mounting mechanism 100 rotates toward track 202 to align skis 101 with cleaning portion 204, waxing portion 205, brushing portion 206, and scraping portion 207 so that such will contact a sole of skis 101 as carriage 203 moves up track 202 and performs the desired cleaning, waxing, brushing, and scraping.

Figure 4:
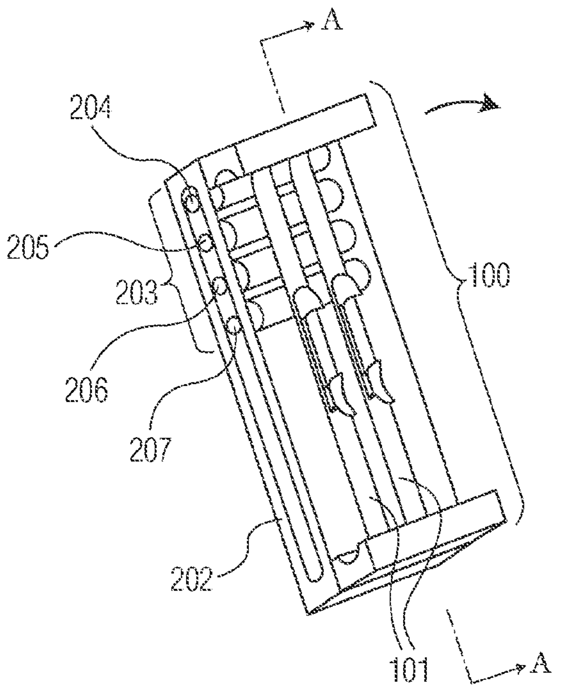
FIG. 4 depicts the automated waxing device of FIG. 3 in a closed configuration.

FIG. 4 depicts the automated waxing device of FIG. 3 in a closed configuration with mounting mechanism 100 and track 202 brought into substantial proximity to allow cleaning portion 204, waxing portion 205, brushing portion 206, and scraping portion 207 to contact a sole of skis 101 with adequate force to perform the automated cleaning, waxing, brushing, and scraping. The closed configuration may have skis 101 substantially vertical, level with the ground, or any degree of rotation in between.

Figure 5:
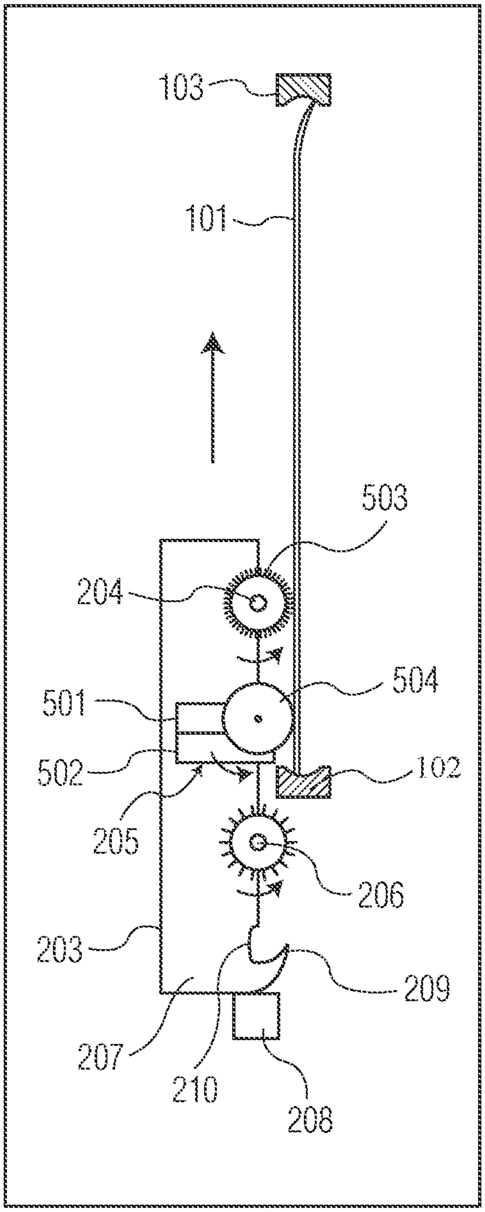
FIG. 5 depicts a cross section along plane A-A of the automated waxing device in FIG. 4.

FIG. 5 depicts a cross section along plane A-A of the automated waxing device in FIG. 4. Ski 101 is held in mounting mechanism 100 by upper track portion 103 and lower track portion 102. Carriage 203 aligns with skis 101 such that cleaning portion 204, waxing portion 205, brushing portion 206, and scraping portion 207 will contact a sole of skis 101 and perform the desired cleaning, waxing, brushing, and scraping along most of the surface of a sole of skis 101 regardless of the curvature of skis 101 as carriage 203 moves up the length of skis 101. This configuration provides a distinct advantage of not having to alter the plane of skis 101 during cleaning, waxing, brushing and scraping to account for curvature in the vertical shape along the long axis of skis 101.

Cleaning portion 204 may, for example, be a substantially cylindrical roller with damp course bristles 503. A dispensing device (not shown) such as a spray nozzle may dispense a cleansing agent on cleaning portion 204 which may be applied by spinning bristles 503 over a sole of skis 101. Alternatively, for example, cleaning portion 204 may apply a spray to a sole of skis 101 and remove the spray with bristles 503. Cleaning portion 204 should be made of materials and cleansing agents which clean a sole of skis 101 and remove, for example, snow, ice, slush, dirt, preexisting wax, or any other substance which can interfere with the application of wax to a sole of a ski or snowboard. Additionally, any cleansing agent dispensed by a dispensing device or applied by cleaning portion 204 may be composed to dry quickly to enable application of wax by waxing portion 205 soon after cleaning a portion of the sole of skis 101.

Waxing portion 205 consists of, for example, a substantially cylindrical heated roller 504 which contacts wax block 501. A portion of wax block 501 melts upon being heated by heated roller 504 and is applied to a sole of skis 101 as it is carried along a portion of the circumference of heated roller 504 as it contact skis 101 by virtue of the viscosity of the melted wax. Heated roller 504 may include, for example, grooves or indents which may align with skis 101 or a snowboard to better perform application of wax.

Heated roller 504 may also locally heat a sole of skis 101 (or a snowboard) as it passes to improve wax absorption. Alternatively, carriage 203 may also include a heating element (not shown) which also heats skis 101. Wax block 501 may be carried by wax carriage 502 that includes a mechanism for maintain contact between wax block 501 and heated roller 504. Additionally, wax carriage 502 may supply heat to heated roller 504. Also, for example, wax carriage 502 may collect and store unused melted wax drippings for future use. Automated waxing device 200 may allow for selection of wax blocks 501 based on current snow conditions and may dispense a wax block 501 which is placed upon or secured to wax carriage 502 prior to activating automated waxing.

Brushing portion 206 may be a substantially cylindrical rotating brush with, for example, fine bristles employed in smoothing wax in preparation for scraping. Brushing portion 206 may be rotated by motor 208 at a variety of speeds appropriate to provide desired texture according to the properties of wax applied to skis 101 and for the snow conditions. Alternatively brushing portion 206 may be aligned below scraping mechanism 207 or a second brushing portion 206 may be aligned such that brushing occurs before and after scraping a sole of skis 101. In this example, a first brushing portion 206 may be of a more coarse texture to maximize effectiveness of scraping portion 207 and second brushing portion 206 may be of a more fine texture to ensure additional smoothing of a sole of skis 101.

Second brushing portion 206 may only be optionally used as carriage 203 passes along a sole of skis 101 and may be disengaged from contact skis 101 if snow conditions call for a less smooth wax application on a sole of skis 101.

Scraping portion 207 may be, for example, a hooked scraping edge 209 and a detritus collection area 210. As scraping portion 207 passes along a sole of skis 101, scraping edge 209 contacts wax applied by waxing portion 205 and scrapes off at least some wax to smooth the outer surface of the sole of skis 101. Scraping portion 207 may be formed of a material which provides adequate resistive force to enable an appropriate amount of scraping by scraping edge 209, or, alternatively, may consist of a spring mechanism to maintain contact between scraping edge 209 and a sole of skis 101. As an additional example, scraping edge may be a tapered hard plastic, a blade, a sharp edge, or any other known substance or configuration known in the art for scraping unwanted wax. As an additional example, scraping portion 207 can apply selective resistive force such that scraping edge 209 scrapes a desired amount of wax from selected wax block 501, or scrapes different portions of a sole of skis 101 differently (e.g., scrapes the center of a sole of skis 101 less than the upper or lower portions of a sole of skis 101). Scraping portion 207 may also contain wax collection area 210 which can collect wax scrapings from scraping edge 209 for recycling into new wax blocks 501. Scraping mechanism 207 may include a receptacle for collecting excess wax removed by scraping mechanism 207, a heating device for melting the collected excess wax, and a wax dispensing device for reusing the melted collected excess wax in subsequent wax applications.

Figure 6:
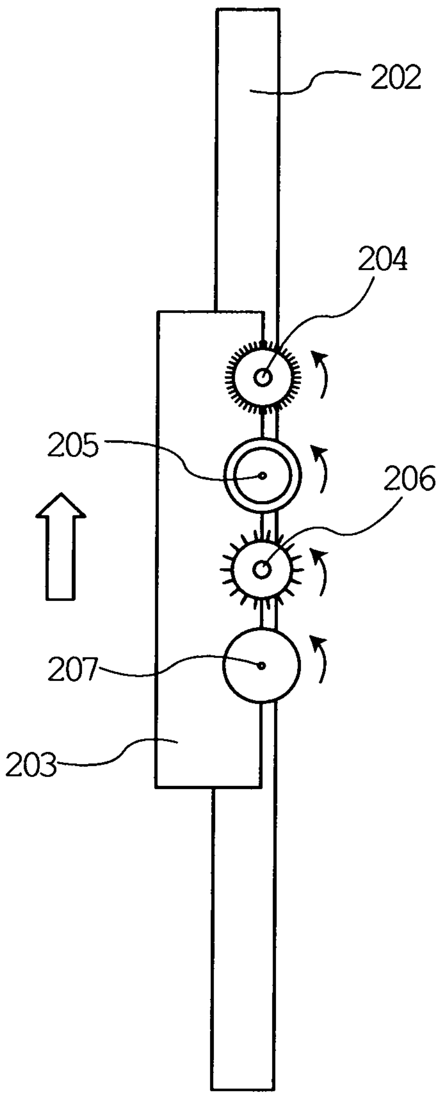
FIG. 6 depicts a first embodiment of a displaceable cleaning device, waxing mechanism, and scraping mechanism.

FIG. 6 depicts a first configuration of carriage 203 where cleaning device 204, waxing mechanism 205, brushing mechanism 206 and scraping portion 207 are substantially aligned in-line along the vertical axis of carriage 203. As motors 208 move carriage 203 up track 202, they may spin substantially cylindrical cleaning device 204, waxing mechanism 205, and brushing mechanism 206, for example in a counter clockwise direction or in any way suitable for performing cleaning, waxing, and brushing. Alternatively, motors 208 may spin cleaning device 204, waxing mechanism 205, and brushing mechanism 206 individually or together in a programmed manner to enable optimal wax application and smoothness for current snow conditions. In the example shown in FIG. 6, a single pass of carriage 203 along track 202 may be sufficient for complete cleaning, wax application, brushing, and scraping of a sole of ski 101.

Alternatively, if additional deposition of wax layers is desired or programmed, carriage 203 may return to its starting position after completing one pass along track 202 and perform one or more additional passes along the length of skis 101 or a snowboard.

Figure 7:
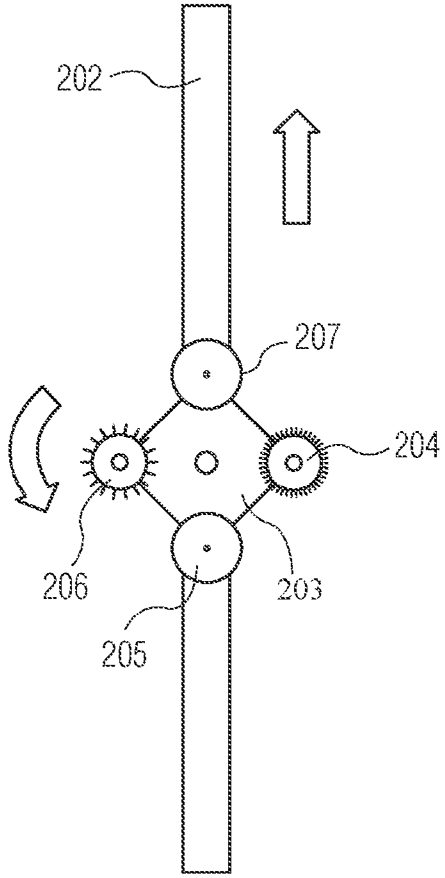
FIG. 7 depicts a second embodiment of a displaceable cleaning device, waxing mechanism, and scraping mechanism.

FIG. 7 depicts a second configuration of carriage 203 where cleaning device 204, waxing mechanism 205, brushing mechanism 206 and scraping portion 207 are each sequentially aligned to contact a sole of skis 101 during a single pass of carriage 203 along track 202. For example, in the configuration of FIG. 7, motors 208 may rotate carriage 203 in its starting position such that cleaning device 204 aligns to contact a sole of skis 101 in a first pass up track 202, then rotates carriage 203 such that waxing mechanism 205 aligns to contact a sole of skis 101 in a second pass down track 202, then rotates carriage 203 such that brushing mechanism 206 aligns to contact a sole of skis 101 in a third pass up track 202, and then rotates carriage 203 such that scraping portion 207 aligns to contact a sole of skis 101 in a fourth pass down track 202. This four-pass configuration may also require that carriage 203 always return to its starting position before motors 208 rotate carriage 203 so all steps are performed while passing up track 202.

Figure 8:
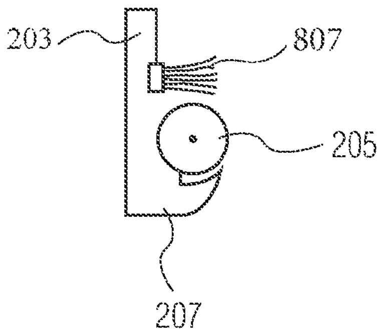
FIG. 8 depicts a third embodiment of a displaceable cleaning device, waxing mechanism, and scraping mechanism.

FIG. 8 depicts a third configuration of carriage 203 with a fixed brushing mechanism 807 situated adjacent to a waxing mechanism 205 that also includes a brush texture, and a scraping portion 207. In this configuration of FIG. 8, the steps of brushing and waxing may be combined in a single step to reduce the number of passes of carriage 203 along track 202 to complete automated waxing of skis 101. Other configurations which combine cleaning, waxing, brushing and scraping are also possible to combine steps required for automated waxing of skis 101.

Figure 9:
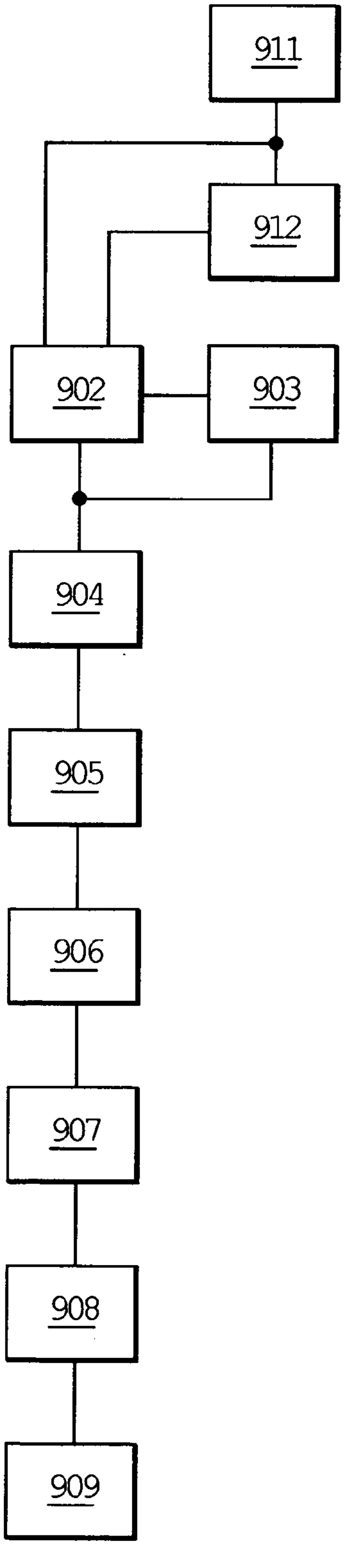
FIG. 9 depicts a flow diagram showing method steps according to one embodiment of the disclosure.

FIG. 9 depicts a flow diagram showing method steps according to one embodiment of the disclosure. In step 911 a user inputs information into a user interface 211 or provides information from, for example, a smartphone or contactless tag in a piece of snow sport equipment. This information can be, for example snow conditions, make and model of the snow sport equipment, size of the snow sport equipment, type of skier or rider, or any other information pertinent to selection of type of wax and process steps for optimal application of that type of wax. In optional step 912 a user may be required to provide payment for use of the automated waxing device 200 by any means of payment know in the art prior to the user interface instructing a locking mechanism 212 to allow access to the user. Alternately, no payment may be required for access.

Once access to a housing 201 is permitted in step 902, a user inserts at least one pair of skis 101 or snowboard into mounting mechanism 100. Mounting mechanism 100 may be manually operated by the user to secure ski 101, automatically operated by motors 208 to secure ski 101, or some combination thereof and housing 201 may be closed. Step 902 may be performed by displacing a lower portion track 102 or an upper portion track 103 to contact a first and second end of said at least one pair of skis or snowboard. If automated waxing device is so configured or a wax is manually selected by the user, a wax block 501 may be selected from a variety of wax blocks in step 903 based on the information input in step 911 and placed upon or secured to wax carriage 502. In 904 mounting mechanism 100 and carriage 203 are brought into proximity (either by moving one or both) to allow contact between cleaning device 204, waxing mechanism 205, brushing mechanism 206 and scraping portion 207 and a sole of the inserted at least one pair of skis 101 or snowboard. In step 905 cleaning device 204 cleans the at least one pair of skis 101 or snowboard. In step 906 waxing mechanism 205 applies wax (heated or at ambient temperature) to at least a portion of the sole of the at least one pair of skis 101 or snowboard. In step 907 a scraping portion removes excess wax deposited during step

906. Step 907 may also include brushing. In step 908, mounting mechanism 100 and carriage 203 are returned to substantially their original positions. In step 909 after a predetermined period of time to allow for cooling, locking mechanism 212 may be opened and the at least one pair of skis 101 or snowboard are released for removal from automated waxing device 200. Steps 905, 906, and 907 may be performed in a single pass of carriage 203 along track 202. Alternatively Steps 905, 906, and 907 may be performed in a more than one pass of carriage 203 along track 202. Further steps 905, 906, and 907 may be performed in a pre-programmed manner to optimize application of wax for the type of wax selected in step 903.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. An automated device, comprising:

a mounting mechanism for securing at least one pair of skis or at least one snowboard;

a cleaning device for cleaning the at least one pair of skis or at least one snowboard;

a waxing mechanism for depositing wax on at least a portion of a sole of the at least one pair of skis or at least one snowboard;

a scraping mechanism for removing excess wax deposited by the waxing mechanism; and at least one motor for displacing the cleaning device, the waxing mechanism, and the scraping mechanism along at least a portion of the at least one pair of skis or at least one snowboard;

wherein the mounting mechanism comprises an upper track portion for securing one end of the at least one pair of skis or at least one snowboard during cleaning, waxing, and scraping of the at least one pair of skis or at least one snowboard;

wherein the automatic device is configured to enable the cleaning, waxing and scraping of the at least one pair of skis or at least one snowboard without requiring a user to be wearing the at least one pair of skis or at least one snowboard when the at least one pair of skis or at least one snowboard is cleaned, waxed and scraped.

2. The automated device of claim 1, wherein the mounting mechanism is configured to secure the at least one pair of skis or at least one snowboard in a single temporary position during cleaning, waxing, and scraping of the at least one pair of skis or at least one snowboard.

3. The automated device of claim 1, wherein the mounting mechanism, the cleaning device, the waxing mechanism, the scraping mechanism, and the at least one motor are disposed in a housing comprising multiple types of wax which may be applied to the at least one pair of skis or at least one snowboard by the waxing mechanism.

4. The automated device of claim 3, wherein the housing further comprises a user interface which allows a user to select the type of wax to be applied to the at least one pair of skis or at least one snowboard and to pay for services provided by the automated device.

5. The automated device of claim 3, wherein the housing further comprising:

a system which selects the appropriate type of wax for the ski or snowboard conditions from the multiple types of wax in the housing; and a programmable processor and an interface for receiving real-time information regarding the ski or snowboard conditions.

6. The automated device of claim 1, wherein the mounting mechanism further comprising a locking mechanism for securing the at least one pair of skis or at least one snowboard and providing adequate exposure and resistive force to allow the cleaning device, the waxing mechanism, and the scraping mechanism to effectively clean, wax, and scrape the at least one pair of skis or at least one snowboard.

7. The automated device of claim 1, wherein the scraping mechanism further comprising:

a receptacle for collecting excess wax removed by the scraping mechanism;

a heating device for melting the collected excess wax; and a wax dispensing device for reusing the melted collected excess wax in subsequent wax applications.

8. The automated device of claim 1, wherein the waxing mechanism further comprising at least one roller for applying hot wax to at least a portion of a sole of the at least one pair of skis or at least one snowboard.

9. The automated device of claim 1, further comprising a carriage; wherein the cleaning device, the waxing mechanism, and the scraping mechanism are disposed on the carriage; wherein the at least one motor is configured to displace the carriage along at least a portion of the at least one pair of skis or at least one snowboard.

10. The automated device of claim 9, wherein the cleaning device, the waxing mechanism, and the scraping mechanism are aligned on the carriage such that when the at least one motor displaces the carriage, the cleaning device cleans, the waxing mechanism waxes, and the scraping mechanism scrapes at least a portion of the at least one pair of skis or at least one snowboard all in a single pass of the carriage.

11. The automated device of claim 9, wherein the cleaning device, the waxing mechanism, and the scraping mechanism are arranged on the carriage such that:

the at least one motor displaces the carriage in a first pass during the cleaning of the at least one pair of skis or at least one snowboard by the cleaning device, the at least one motor displaces the carriage in a second pass during the waxing of the at least one pair of skis or at least one snowboard by the waxing mechanism, and the at least one motor displaces the carriage in a third pass during the scraping of the at least one pair of skis or at least one snowboard by the scraping mechanism.

12. The automated device of claim 9, wherein the cleaning device, the waxing mechanism, and the scraping mechanism are aligned on the carriage such that when the at least one motor displaces the carriage at least two of the cleaning device, the waxing mechanism, and the scraping mechanism perform their functions on at least a portion of the at least one pair of skis or at least one snowboard in a single pass of the carriage.

13. The automated device of claim 1, further comprising:

at least one means for enabling the cleaning device to clean the at least one pair of skis or at least one snowboard;

at least one means for enabling the waxing mechanism to wax the at least one pair of skis or at least one snowboard; and at least one means for enabling the scraping mechanism to scrape the at least one pair of skis or at least one snowboard.

14. The automated device of claim 1, further comprising a brushing mechanism for brushing the at least one pair of skis or at least one snowboard.

15. A method performed by an automated device, wherein the automated device, comprising:

a mounting mechanism for securing at least one pair of skis or at least one snowboard;

a cleaning device for cleaning the at least one pair of skis or at least one snowboard;

a waxing mechanism for depositing wax on at least a portion of a sole of the at least one pair of skis or at least one snowboard;

a scraping mechanism for removing excess wax deposited by the waxing mechanism; and a carriage whereon the cleaning device, the waxing mechanism, and the scraping mechanism are disposed;

at least one motor for displacing the cleaning device, the waxing mechanism, and the scraping mechanism along at least a portion of the at least one pair of skis or at least one snowboard;

wherein the mounting mechanism comprises an upper track portion for securing a first end of the at least one pair of skis or at least one snowboard during cleaning, waxing, and scraping of the at least one pair of skis or at least one snowboard;

wherein the automatic device is configured to enable the cleaning, waxing and scraping of the at least one pair of skis or at least one snowboard without requiring a user to be wearing the at least one pair of skis or at least one snowboard when the at least one pair of skis or at least one snowboard is cleaned, waxed and scraped; and wherein the method comprising:

securing the at least one pair of skis or at least one snowboard on the mounting mechanism;

displacing the carriage at least once along the at least one pair of skis or at least one snowboard for at least the purpose of:

cleaning at least a portion the at least one pair of skis or at least one snowboard;

applying wax to at least a portion of the at least one pair of skis or at least one snowboard; and removing excess wax deposited on at least a portion of the at least one pair of skis or at least one snowboard; and releasing the at least on pair of skis or at least one snowboard from the mounting mechanism when the wax is substantially cooled.

16. The method of claim 15, wherein securing the at least one pair of skis or at least one snowboard on the mounting mechanism further comprising:

receiving a second end of the at least one pair of skis or at least one snowboard in a lower track portion of the automated device;

displacing the upper track portion to contact the first end of the at least one pair of skis or at least one snowboard; and locking the at least one pair of skis or at least one snowboard during the process of cleaning, applying wax on, and removing excess wax from the at least one pair of skis or at least one snowboard.

17. The method of claim 16, wherein displacing the upper track portion and locking the at least one pair of skis or at least one snowboard are automatically performed upon receiving the second end of the at least one pair of skis or at least one snowboard in the lower track portion.

18. The method of claim 15, wherein displacing the carriage at least once along the at least one pair of skis or at least one snowboard further comprising cleaning, applying wax, and removing excess wax in a single pass of the carriage along the at least one pair of skis or at least one snowboard.

19. The method of claim 15, wherein displacing of the carriage at least once along the at least one pair of skis or at least one snowboard further comprising performing each of the cleaning, applying wax, and removing excess wax processes in separate passes of the carriage along the at least one pair of skis or at least one snowboard.

20. The method of claim 15, wherein displacing the carriage at least once along the at least one pair of skis or at least one snowboard further comprising performing at least two of the cleaning, applying wax, and removing excess wax processes in a single passes of the carriage along the at least one pair of skis or at least one snowboard.

21. The method of claim 15, wherein applying wax to at least a portion of the at least one pair of skis or at least one snowboard further comprising applying heated wax along at least a portion of a sole of the at least one pair of skis or at least one snowboard.

22. The method of claim 15, wherein removing excess wax deposited on the at least one pair of skis or at least one snowboard further comprising brushing the at least one pair of skis or at least one snowboard.

23. The method of claim 15, wherein applying wax to at least a portion of the at least one pair of skis or at least one snowboard further comprising selecting a type of wax from a variety of wax types.

24. The method of claim 23, wherein selecting a type of wax is performed based at least in part on the applicable ski or snowboard conditions.

* * * * *